(12) United States Patent
Neuenschwander et al.

(10) Patent No.: US 10,969,413 B2
(45) Date of Patent: Apr. 6, 2021

(54) ENERGY THEFT DETECTION DEVICE

(71) Applicant: Honeywell International Inc., Morris Plains, NJ (US)

(72) Inventors: Victoria Neuenschwander, Cary, NC (US); Richard Carpenter, Fuquay Varina, NC (US)

(73) Assignee: Honeywell International Inc., Morris Plains, NJ (US)

( * ) Notice: Subject to any disclaimer, the term of this patent is extended or adjusted under 35 U.S.C. 154(b) by 70 days.

(21) Appl. No.: 16/159,606

(22) Filed: Oct. 12, 2018

(65) Prior Publication Data
US 2020/0081045 A1 Mar. 12, 2020

Related U.S. Application Data

(60) Provisional application No. 62/572,382, filed on Oct. 13, 2017.

(51) Int. Cl.
*G01R 22/06* (2006.01)
*G01D 4/00* (2006.01)
*G06Q 50/06* (2012.01)

(52) U.S. Cl.
CPC .......... *G01R 22/066* (2013.01); *G01D 4/006* (2013.01); *G06Q 50/06* (2013.01)

(58) Field of Classification Search
CPC ...... G01R 22/066; G01D 4/006; G01D 4/004; G06Q 50/06; H04Q 2209/60; H04Q 2209/823; H04Q 9/00
USPC ....................................................... 324/110
See application file for complete search history.

(56) References Cited

U.S. PATENT DOCUMENTS

| | | | | |
|---|---|---|---|---|
| 4,532,471 | A * | 7/1985 | Hurley | G01R 22/066 324/110 |
| 7,986,246 | B2 | 7/2011 | Angelis et al. | |
| 2007/0247789 | A1* | 10/2007 | Benson | G06Q 50/06 361/672 |
| 2011/0068947 | A1* | 3/2011 | Holman | G01D 4/004 340/870.02 |
| 2012/0036250 | A1* | 2/2012 | Vaswani | G01D 4/004 709/224 |
| 2012/0062210 | A1* | 3/2012 | Veillette | H04Q 9/00 324/110 |

(Continued)

FOREIGN PATENT DOCUMENTS

| | | |
|---|---|---|
| CN | 102042885 B | 5/2012 |
| WO | 2013033576 A1 | 3/2013 |

(Continued)

OTHER PUBLICATIONS

Zhou et al., "Robust Real-Time UAV Based Power Line Detection and Tracking", IEEE, pp. 744-748, 2016.

(Continued)

*Primary Examiner* — Christopher P McAndrew

(57) ABSTRACT

A device for detecting energy theft from a utility network configured to access energy data for utilities, generate energy results, identify an outlying utility in the energy results, access behavioral data, determine whether there is a likelihood of energy theft associated with the outlying utility, generate descriptive results from the behavioral data indicating the likelihood of energy theft, receive a response of whether the energy theft occurred, and refine operation of the detecting of energy theft of the device.

19 Claims, 11 Drawing Sheets

(56) References Cited

U.S. PATENT DOCUMENTS

| | | | |
|---|---|---|---|
| 2013/0054162 A1 | 2/2013 | Smith et al. | |
| 2013/0325147 A1* | 12/2013 | Karnouskos | G06Q 10/063 700/30 |
| 2014/0074670 A1 | 3/2014 | Garrity et al. | |
| 2014/0236506 A1* | 8/2014 | Nikovski | G01R 22/066 702/61 |
| 2014/0327555 A1* | 11/2014 | Sager | G08B 25/10 340/870.16 |
| 2014/0368189 A1* | 12/2014 | Bernheim | G01R 22/066 324/115 |
| 2014/0379303 A1 | 12/2014 | Chandrashekaraiah et al. | |
| 2015/0131079 A1 | 5/2015 | Heinonen et al. | |
| 2016/0161539 A1* | 6/2016 | Kraft | G01R 22/066 324/110 |
| 2016/0320431 A1* | 11/2016 | Driscoll | G01R 22/066 |
| 2016/0327603 A1* | 11/2016 | Sonderegger | H02J 13/00002 |
| 2016/0352142 A1* | 12/2016 | Hughes | H02J 13/0006 |
| 2017/0038415 A1* | 2/2017 | Dasgupta | G01R 19/2513 |
| 2017/0082665 A1 | 3/2017 | Bandyopadhyay et al. | |
| 2017/0154387 A1* | 6/2017 | Somers | H02J 3/14 |
| 2018/0299495 A1 | 10/2018 | Abbas | |
| 2018/0364286 A1* | 12/2018 | Sharp | G01R 22/063 |
| 2018/0364287 A1* | 12/2018 | Sharp | G06Q 50/06 |
| 2019/0086461 A1* | 3/2019 | Dale | G01R 25/00 |

FOREIGN PATENT DOCUMENTS

| | | |
|---|---|---|
| WO | 2016049369 A1 | 3/2016 |
| WO | 2016122966 A1 | 8/2016 |
| WO | 2017115341 A1 | 7/2017 |

OTHER PUBLICATIONS

International Search Report and Written Opinion for Application No. PCT/US2018/055753, 14 pages, dated Dec. 13, 2018.
International Search Report and Written Opinion for Application No. PCT/US2018/055751, 12 pages, dated Jan. 22, 2019.
nternational Search Report and Written Opinion for Application No. PCT/US2018/055748, 14 pages, dated Jan. 29, 2019.

* cited by examiner

ENERGY THEFT DETECTION DEVICE

This application claims the benefit of U.S. Provisional Patent Application Ser. No. 62/572,382, filed Oct. 13, 2017. U.S. Provisional Patent Application Ser. No. 62/572,382, filed Oct. 13, 2017, is hereby incorporated by reference.

TECHNICAL FIELD

The disclosure relates generally to energy theft, and more particularly to energy theft from a utility network.

BACKGROUND

Non-Technical Loss (NTL), also known as energy theft, is the illegal practice of stealing electrical power. Energy theft involves interfering with an electric meter device and/or associated supply equipment to avoid or reduce the true payment due for energy supplied. Energy theft goes by several names but typically occurs in two ways-diversion and tampering. Meter diversion involves bypassing energy around the meter such as tapping into utility conductors before the meter or jumpering around a meter. Tampering causes the meter to create false consumption information. Examples include impeding the meter from making an accurate reading, meter swaps, or turning the meter upside-down (inverted) temporarily to make it run backwards. As of 2016 NTL/energy theft presented a 90 billion dollar loss to utilities world-wide. NTL burdens the country's economy, energy customers, taxpayers, and the productive sector (services, commerce and industry) by increasing energy costs and degrading the quality of energy. What would be desirable is an approach to detect NTL to allow a user to inspect the premises to stop the NTL. The user may then provide feedback whether the NTL actually occurred that can then be used to enhance the NTL detection capability.

SUMMARY

In an example of the disclosure, a device for detecting energy theft from a utility network may be configured to access energy data for utilities that may indicate at least amounts of energy elicited and locations of the utilities, generate energy results from the energy data, identify an outlying utility in the energy results, access behavioral data associated with the outlying utility, a set of utilities having a relationship with the outlying utility, and a geographical region where the outlying utility is located, determine whether there is a likelihood of energy theft associated with the outlying utility based on the behavioral data, generate descriptive results from the behavioral data indicating the likelihood of energy theft associated with the outlying utility, receive a response of whether the energy theft associated with the outlying utility occurred, and refine operation of the detecting of energy theft of the device using the response of whether the energy theft associated with the outlying utility occurred.

Alternatively or additionally to the foregoing, the device may be further configured to determine a confidence score of whether there is the likelihood of energy theft associated with the outlying utility.

Alternatively or additionally to any of the embodiments above, the confidence score may further include a set of scores for alternate reasons, the outlying utility is an outlier in the energy results.

Alternatively or additionally to any of the embodiments above, the behavioral data may incorporate property tax data, micro-economic data, weather data, crime statistics, and social media data.

Alternatively or additionally to any of the embodiments above, the descriptive results may include an alert and the device may be further configured to send the alert to a remote device for an investigator to check an area where the outlying utility may be located for evidence of the energy theft.

Alternatively or additionally to any of the embodiments above, the investigator may send the response of whether the energy theft associated with the outlying utility occurred based on the evidence of the energy theft.

Alternatively or additionally to any of the embodiments above, the device may be further configured to determine a potential suspect of the energy theft, filter the descriptive results based at least on the potential suspect of the energy theft, and send the filtered descriptive results to an employee.

Alternatively or additionally to any of the embodiments above, the potential suspect may include the employee.

Alternatively or additionally to any of the embodiments above, the descriptive results may incorporate graphs generated from a set of the behavioral data, news activity associated with the geographical region, and maps of the geographical region highlighting at least the outlying utility.

Alternatively or additionally to any of the embodiments above, the energy results may be configured to be categorized according to types of the utilities.

In another example of the disclosure, a system for detecting energy theft from a utility network may incorporate a set of meter devices for accumulating energy data for utilities that may indicate at least amounts of energy elicited and locations of the utilities and a device operatively coupled to the set of meter devices and may be configured to receive the energy data, generate energy results from the energy data, where the energy results are configured to be categorized according to types of the utilities. The device may be further configured to identify an outlying utility in the energy results, access behavioral data associated with the outlying utility, a set of utilities having a relationship with the outlying utility, and a geographical region where the outlying utility is located, determine whether there is a likelihood of energy theft associated with the outlying utility based on the behavioral data, generate descriptive results from the behavioral data indicating the likelihood of energy theft associated with the outlying utility, receive a response of whether the energy theft associated with the outlying utility occurred, and refine operation of the detecting of energy theft of the device using the response of whether the energy theft associated with the outlying utility occurred.

Alternatively or additionally to any of the embodiments above, the device may be further configured to determine a confidence score of whether there is the likelihood of energy theft associated with the outlying utility.

Alternatively or additionally to any of the embodiments above, the descriptive results may include an alert and the device is further configured to send the alert to a remote device for an investigator to check an area where the outlying utility is located for evidence of the energy theft.

Alternatively or additionally to any of the embodiments above, the investigator may send the response of whether the energy theft associated with the outlying utility occurred based on the evidence of the energy theft.

Alternatively or additionally to any of the embodiments above, the device further may be further configured to determine a potential suspect of the energy theft, filter the descriptive results based at least on the potential suspect of the energy theft, and send the filtered descriptive results to an employee.

Alternatively or additionally to any of the embodiments above, the potential suspect may include the employee.

In another example of the disclosure, a method for detecting energy theft may incorporate accessing energy data for utilities indicating at least amounts of energy elicited and locations of the utilities, generating energy results from the energy data, identifying an outlying utility in the energy results, accessing behavioral data associated with the outlying utility, a set of utilities having a relationship with the outlying utility, and a geographical region where the outlying utility is located, determining whether there is a likelihood of energy theft associated with the outlying utility based on the behavioral data, generating descriptive results from the behavioral data indicating the likelihood of energy theft associated with the outlying utility, receiving a response of whether the energy theft associated with the outlying utility occurred, and refining operation of the detecting of energy theft of the device using the response of whether the energy theft associated with the outlying utility occurred.

Alternatively or additionally to any of the embodiments above, the method may further incorporate determining a confidence score of whether there is the likelihood of energy theft associated with the outlying utility.

Alternatively or additionally to any of the embodiments above, the descriptive results may include an alert and the device is further configured to send the alert to a remote device for an investigator to check an area where the outlying utility is located for evidence of the energy theft.

Alternatively or additionally to any of the embodiments above, the method may further incorporate determining a potential suspect of the energy theft, filtering the descriptive results based at least on the potential suspect of the energy theft, and sending the filtered descriptive results to an employee.

The above summary of some illustrative embodiments is not intended to describe each disclosed embodiment or every implementation of the present disclosure. The Figures and Description which follow more particularly exemplify these and other illustrative embodiments.

BRIEF DESCRIPTION OF THE FIGURES

The disclosure may be more completely understood in consideration of the following description in connection with the accompanying drawings, in which.

Figure 1:
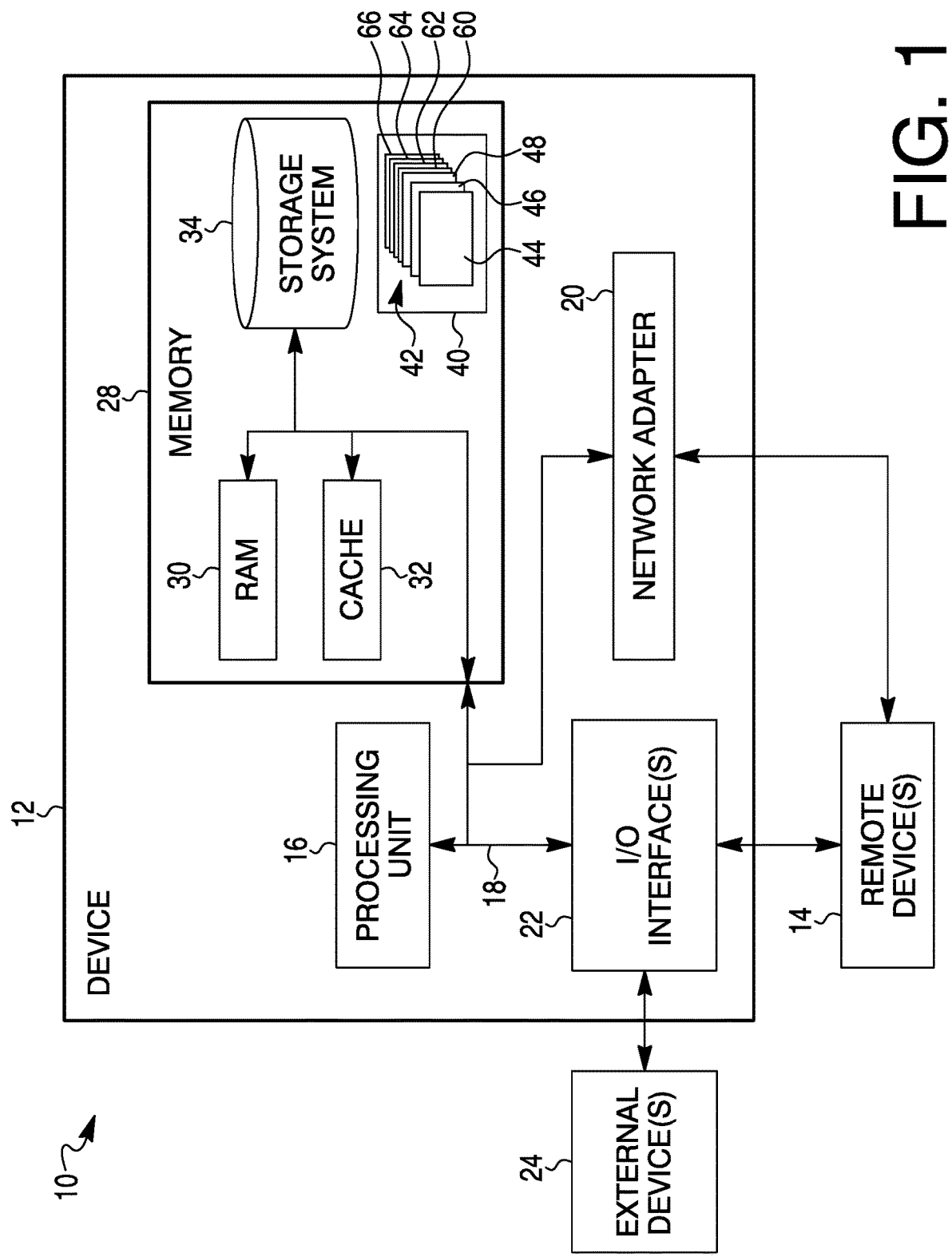
FIG. 1 is a schematic of a cloud computing node.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DESCRIPTION

For the following defined terms, these definitions shall be applied, unless a different definition is given in the claims or elsewhere in this specification.

All numeric values are herein assumed to be modified by the term "about," whether or not explicitly indicated. The term "about" generally refers to a range of numbers that one of skill in the art would consider equivalent to the recited value (i.e., having the same function or result). In many instances, the terms "about" may include numbers that are rounded to the nearest significant figure.

The recitation of numerical ranges by endpoints includes all numbers within that range (e.g., 1 to 5 includes 1, 1.5, 2, 2.75, 3, 3.80, 4, and 5).

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include one or more particular features, structures, and/or characteristics. However, such recitations do not necessarily mean that all embodiments include the particular features, structures, and/or characteristics. Additionally, when particular features, structures, and/or characteristics are described in connection with one embodiment, it should be understood that such features, structures, and/or characteristics may also be used connection with other embodiments whether or not explicitly described unless clearly stated to the contrary.

The following description should be read with reference to the drawings in which similar structures in different drawings are numbered the same. The drawings, which are not necessarily to scale, depict illustrative embodiments and are not intended to limit the scope of the disclosure. Although examples of construction, dimensions, and materials may be illustrated for the various elements, those skilled in the art will recognize that many of the examples provided have suitable alternatives that may be utilized.

Energy (e.g., electricity) may be transmitted from large power plants to the utilities/consumers via extensive utility networks. The transmission over long distances creates energy losses. In some cases, energy losses may be attributed to technical issues, such as, for example, energy dissipated in the conductors, equipment used for transmission lines, transformers, sub-transmission and distribution lines, and magnetic losses in transformers. Technical losses may directly depend on the network characteristics and the mode of operation. In other cases, energy losses may also be attributed to non-technical issues, such as theft. In some examples, energy theft can be accomplished by diverting energy from a neighboring energy consumer, removing/ tampering/switching of meters, wiring a partial or full bypass of a meter, direct connection to the primary voltage grid/distribution feeder (e.g., power lines) with a pirate distribution transformer, and simply refusing to pay for services.

The current disclosure relates to devices, controllers, systems, computer programs, and methods adapted for detecting energy theft from a utility network. In some cases, energy data for utilities, indicating an amount of energy elicited and the location of the utility, may be accessed to generate energy results or energy consumption results for the utilities. In some cases, outlying utilities or utilities that have energy results that deviate substantially from a norm of the energy results may be identified and behavioral data may be accessed for the outlying utilities. In some instances, the behavioral data may be associated with the outlying utilities, utilities having a relationship with the outlying utilities, and/or a geographical region where the outlying utilities are located. A likelihood of energy theft associated with the outlying utilities may be determined based on the behavioral data and descriptive results may be generated from the behavioral data that indicate the likelihood of energy theft associated with the outlying utilities. In some cases, the outlying utilities and the areas around the outlying utilities may be investigated to determine if energy theft occurred and a response may be received indicating whether the energy theft occurred. In some instances, the response may then be used to refine the operation of the detecting of energy theft of the device using the response of whether the energy theft associated with the outlying utilities occurred.

It is understood in advance that although this disclosure includes a detailed description on cloud computing, implementation of the teachings recited herein are not limited to a cloud computing environment. Rather, embodiments of the present disclosure are capable of being implemented in conjunction with any other type of device or computing environment now known or later developed. Cloud computing may be a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. Moreover, a cloud computing environment may be service oriented with a focus on statelessness, low coupling, modularity, and semantic interoperability. At the heart of cloud computing may be an infrastructure comprising a network of interconnected nodes.

FIG. 1 depicts a schematic of an example of a cloud computing node 10. The cloud computing node 10 is only one example of a suitable cloud computing node and is not intended to suggest any limitation as to the scope of use or functionality of embodiments of the system described herein. Regardless, the cloud computing node 10 is capable of being implemented and/or performing any of the functionalities set forth herein.

In the cloud computing node 10 there may be a device 12 for detecting energy theft from a utilities network. In some cases, the device 12 may be a computer system/server that may be operational with numerous other general purpose or special purpose computing system environments or configurations. Examples of well-known computing systems, environments, and/or configurations that may be suitable for use with the device 12 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The device 12 may be described in the general context of computer system executable instructions, such as program modules, being executed by a computer system. Generally, program modules may include routines, programs, objects, components, logic, data structures, and so on that perform particular tasks or implement particular abstract data types. The device 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, the device 12 in cloud computing node 10 is shown in the form of a general-purpose computing device. The components of the device 12 may include, but are not limited to, one or more processors or processing units 16, a system memory 28, and a bus 18 that couples various system components including system memory 28 to the processor 16.

The bus 18 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

In some instances, the processing unit 16 may include a pre-programmed chip, such as a very-large-scale integration (VLSI) chip and/or an application specific integrated circuit (ASIC). In such embodiments, the chip may be pre-programmed with control logic in order to control the operation of the device 12. In some cases, the pre-programmed chip may implement a state machine that performs the desired functions. By using a pre-programmed chip, the processing unit 16 may use less power than other programmable circuits (e.g., general purpose programmable microprocessors) while still being able to maintain basic functionality. In other instances, the processing unit 16 may include a programmable microprocessor. Such a programmable microprocessor may allow a user to modify the control logic of the device 12 even after it is installed in the field (e.g., firmware update), which may allow for greater flexibility of the device 12 in the field over using a pre-programmed ASIC.

The device 12 may include a variety of computer system readable media. Such media may be any available media that is accessible by the device 12, and it includes both volatile and non-volatile media, removable and non-removable media.

The System memory 28 can include computer system readable media in the form of volatile memory, such as random access memory (RAM) 30 and/or cache memory 32. The device 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM, EPROM, flash memory (e.g., NAND flash memory), an external SPI flash memory or other optical media can be provided. In such instances, each can be connected to the bus 18 by one or more data media interfaces. As will be further depicted and described below, memory 28 may include at least one program product having a set (e.g., at least one) of program modules (e.g., software) that are configured to carry out the functions of embodiments of the system.

Program/utility 40, having a set (e.g., at least one) of program modules 42, may be stored in memory 28 by way of example, and not limitation, as well as an operating system, one or more application programs (e.g., a Non-Technical Loss (NTL) Application 44, a Meter Data Management (MDM) Application 46, and so forth), other program modules, and program data. Each of the operating system, one or more application programs, other program modules, and program data or some combination thereof, may include an implementation of a networking environment. Program modules 42 generally carry out the functions and/or methodologies of embodiments of the system as described herein. In some cases, the program modules 42 and/or the application programs (e.g., the NTL Application 44 and the MDM Application 46) may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages.

The device 12 may also communicate with one or more external devices 24 such as a keyboard, a pointing device, a display, etc.; one or more devices that enable a user to interact with the device 12; and/or any devices (e.g., network card, modem, etc.) that enable the device 12 to communicate with one or more other remote devices 14 such as, for example, a smart phone, tablet computer, laptop computer, personal computer, PDA, and/or the like. Such communication with the external device 24 can occur via Input/Output (I/O) interfaces 22. Still yet, the device 12 can communicate with the external devices 24 and/or the remote devices 14 over one or more networks such as a local area network (LAN), a general wide area network (WAN), and/or a public network (e.g., the Internet) via network adapter 20. As depicted, the I/O interfaces 22 and the network adapter 20 communicate with the other components of the device 12 via bus 18. In some cases, the remote devices 14 may provide a primary and/or a secondary user interface for the user to interact with the device 12. In some cases, the device 12 may utilize a wireless protocol to communicate with the remote devices 14 over the network.

In some instances, the NTL Application 44 and the MDM Application 46 may execute entirely on the device 12, as a stand-alone software package, and/or partly on the device 12 and partly on the remote devices 14. For example, the MDM Application 46 may provide instructions to the processing unit 16 to access energy data from meter devices of a utility network. In some examples, the energy data may be stored locally on the device 12, partially on the device 12 and partially on an external computing architecture/environment, or fully on an external computing architecture/environment. In some cases, the energy data may incorporate the amount of energy elicited or usage data, the locations of the utilities and/or meter devices, and events that are then imported from head-end servers managing the energy data collection in an advanced metering infrastructure (AMI) or automatic meter reading (AMR) systems. In some cases, the MDM Application 46 may incorporate energy data analytics (e.g., the analysis of data emitted by electric meters that record consumption of electric energy) that the processing unit 16 may use to validate, cleanse and process the energy data.

Continuing with the current example, the NTL Application 44 may then provide instructions to the processing unit 16 to use the processed energy data to generate energy results that may include, for example, historic customer billing and account information using billing or time-of-use values in a utility customer information system, as well as detailed load-survey information and seasonally adjusted usage ranges for similar energy consumers (customer class and sub-class). In some examples, the NTL Application 44 may provide instructions to the processing unit 16 to look at the energy results to identify outlying utilities or usage anomalies that fall outside of statistical norms. In some cases, the processing unit 16 may detect certain types of diversion and usage anomalies, such as those caused by defective, slow or stopped meters, simple forms of meter bypass, neighborhood power diversion, unregistered consumers, etc. In some cases, the NTL Application 44 may provide instructions to the processing unit 16 to compare usage to predetermined thresholds and patterns of use and categorize utilities according to the type of the utility (e.g., a home, a building, powerlines, appliances, etc.) or by certain customer classes and even by data, such as household size or business type. To make the models more robust, the NTL Application 44 may incorporate analytics that can leverage additional information, including load-survey data, weather data, and customer information systems for tracking move-out, vacation notifications, foreclosures or other events that affect consumption.

In some cases, the NTL Application 44 may also provide instructions to the processing unit 16 to access "behavioral data". In some examples, the behavioral data may also be stored locally on the device 12, partially on the device 12 and partially on an external computing architecture/environment, or fully on an external computing architecture/environment. In some cases, the behavioral data may be associated with the outlying utilities, utilities having a relationship with the outlying utilities, a geographical region where the outlying utilities are located, etc. For instance, the behavioral data may refer to information produced as a result of actions, such as, actions by individuals/groups (e.g., consumer activity, criminal activity, social network activity, news worthy events, etc.), environmental (e.g., weather) activity, economic/business activity, etc. for a certain geographical region or associated with a utility/energy consumer (e.g., as household or business). The behavioral data may track these actions and be recorded and the behavioral data may then be accessed using a range of devices connected to a network (e.g., the Internet), such as the device 12, a PC, tablet, smartphone, for example. In some instances, the behavioral data may have value because it provides information above and beyond what static data can provide.

In some cases, the behavioral data may permit the NTL Application 44/device 12 to divide individuals/energy consumers into groups on the basis of relationships/similarities that the members of the groups have with one another (e.g., similar sized households or located in the same neighborhood). For example, the NTL Application 44 may take distinct behavioral data from separate datasets (e.g., an eCommerce platform, web application, social network, police records, weather platforms, etc.) and rather than looking at all individuals as one unit, the NTL Application 44 may break them into related groups for analysis. These related groups may share common characteristics or experiences within a defined time-span. Using the grouped behavioral data, the processing unit 16 may see patterns for energy consumers/utility devices, rather than examining across all energy consumers/utility devices without accounting for the common characteristics or experiences they may share. In some instances, by seeing these patterns over time, the processing unit 16 may determine whether there is a likelihood of energy theft in certain areas at or near the outlying utilities. If the processing unit 16 determines there is a likelihood of energy theft, the NTL Application 44 may provide instructions to the processing unit 16 to generate descriptive results from the behavioral data indicating the likelihood of energy theft associated with the outlying utilities.

In some examples, the processing unit 16 may then send the descriptive results to an investigator, a technician and/or an employee of a utility premise/company to check the areas where the outlying utilities are located for evidence of energy theft. The investigator may then send a response to the device 12 of whether or not evidence was found that suggests there is or was energy theft. In some instances, once the device 12 receives the response of whether energy theft occurred, the NTL Application 44 may provide instructions to the processing unit 16 to use the response to refine, validate, cleanse, and/or improve the analytics of the NTL Application 44 and/or the operation of the detecting of energy theft of the device 12. In other words, the response may provide data that helps purge, standardize, tag, categorize, and summarize the behavioral data properly so that the behavioral data may be used to generate descriptive results that more accurately predict whether there is a likelihood of energy theft at certain areas at or near outlying utilities. Accordingly, in some cases, the device 12 may produce reliable, repeatable descriptive results and predictions and uncover "hidden insights" through historical relationships and trends in the behavioral data. As such, in some examples, the device 12 may be configured to "learn" (e.g., progressively improve the energy theft prediction of the descriptive results) from the responses and/or feedback, without being explicitly programmed.

It should be understood that although not shown, other hardware and/or software components could be used in conjunction with the device 12. Examples, include, but are not limited to: microcode, device drivers, redundant processing units, external disk drive arrays, RAID systems, tape drives, and data archival storage systems, and so forth.

Figure 2:
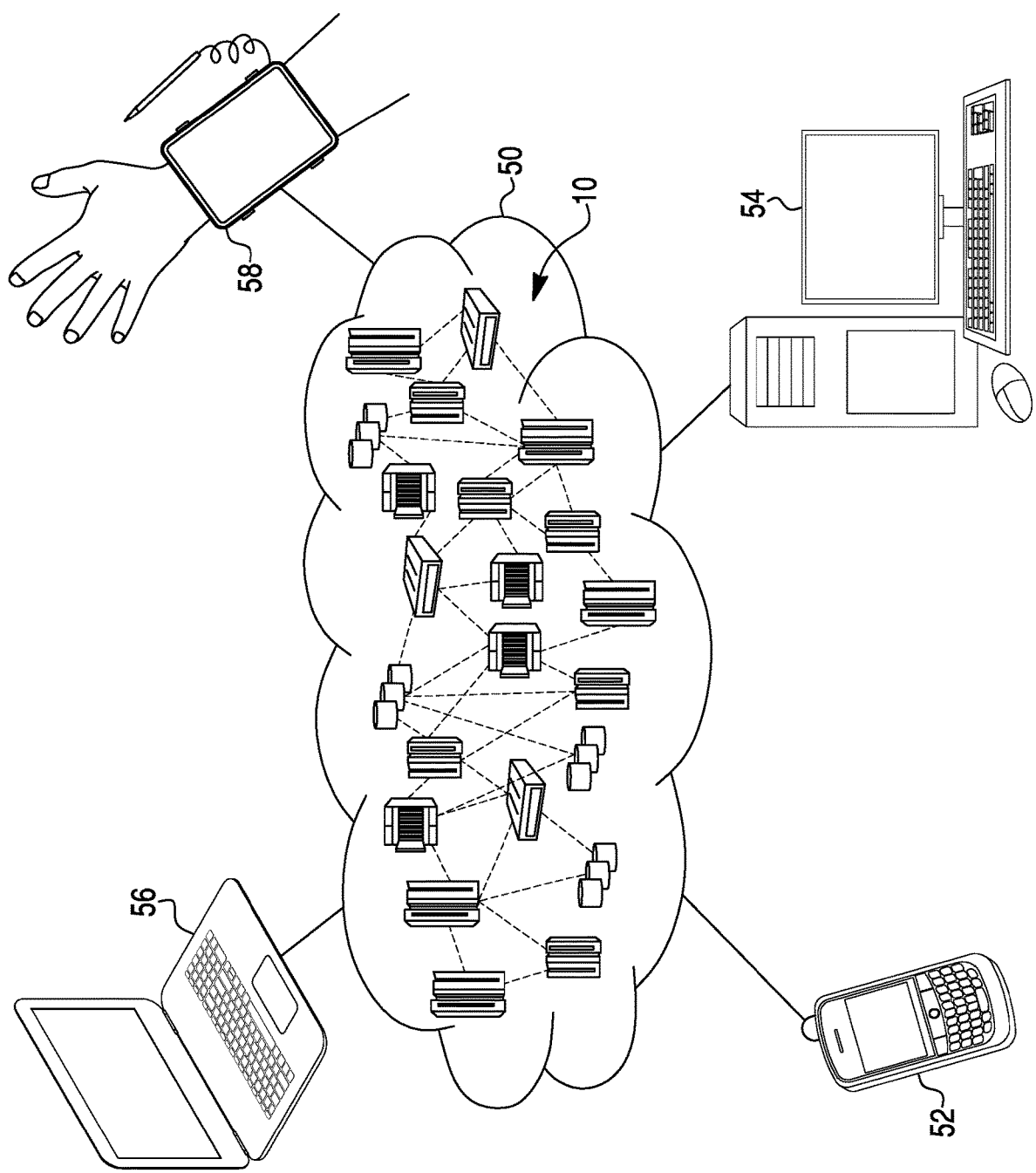
FIG. 2 is an illustrative cloud computing environment.

FIG. 2 depicts an illustrative cloud computing environment 50. As shown, cloud computing environment 50 incorporates one or more cloud computing nodes 10 with which cloud consumers (e.g., utility companies, technicians, investigators, general public, etc.) may use local computing devices, such as, for example, personal digital assistant (PDA) or cellular telephone 52, desktop computer 54, laptop computer 56, and/or a field device 58 may communicate. Nodes 10 may communicate with one another. They may be grouped (not shown) physically or virtually, in one or more networks, such as, for example, Private, Community, Public, or Hybrid clouds, or a combination thereof. This may allow cloud computing environment 50 to offer infrastructure, platforms and/or software (e.g., the NTL Application 44, from FIG. 1) as services for which a cloud consumer does not need to maintain resources on a local computing device. It is understood that the types of computing devices 52, 54, 56 and 58 shown in FIG. 2 are intended to be illustrative only and that computing nodes 10 and cloud computing environment 50 may communicate with any type of computerized device over any type of network and/or network addressable connection (e.g., using a web browser).

Figure 3:
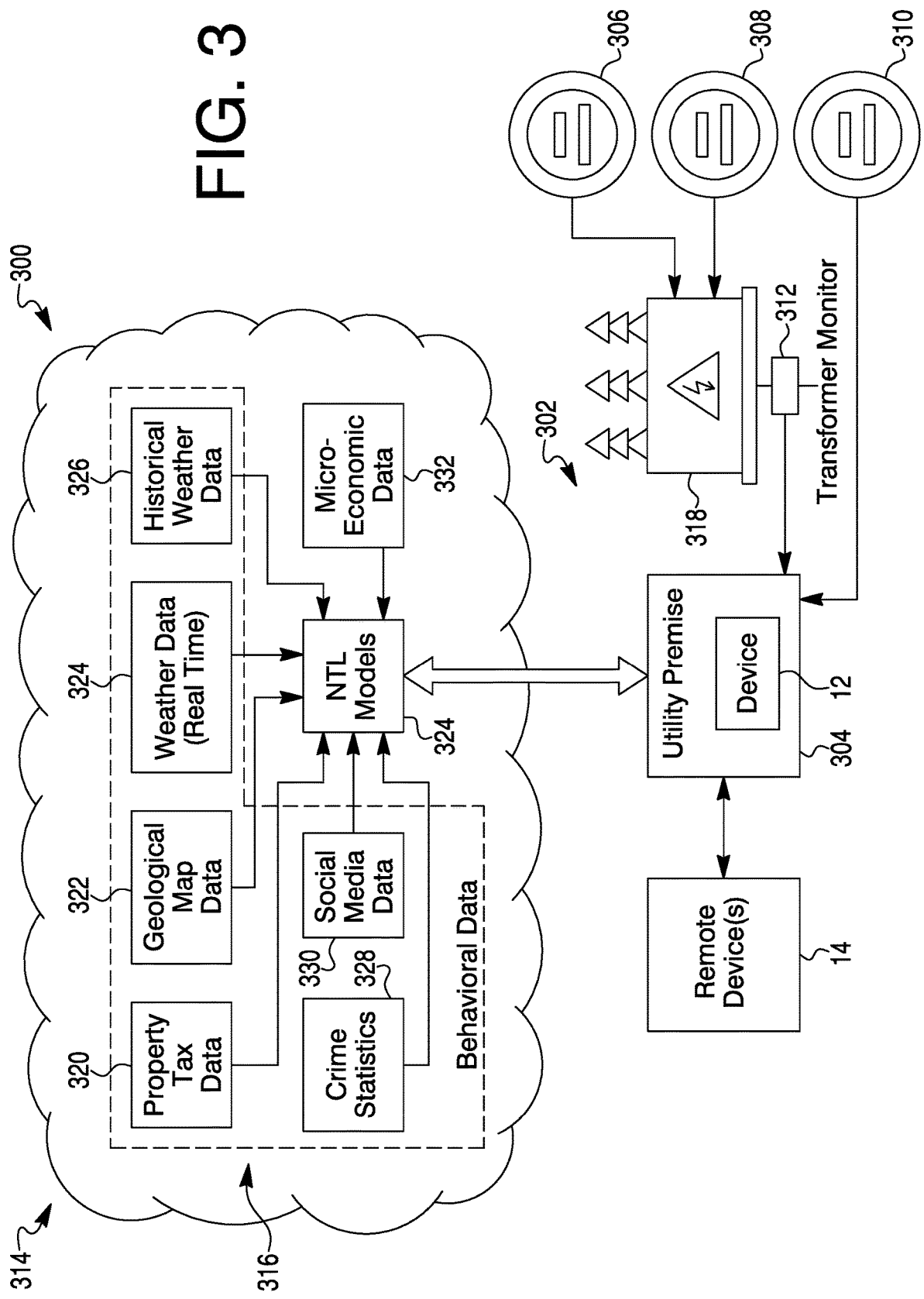
FIG. 3 is an illustrative system for detecting energy theft from a utility network.

FIG. 3 depicts an illustrative system 300 for detecting energy theft from a utility network 302. As shown in FIG. 3, the utility network 302 may include a utility premise 304 (e.g., a power plant/source) that includes the device 12 and distributes energy (e.g., electricity) across power lines 318 of the utility network 302 to a first utility/structure (or energy consuming entity) that has a metering device 306 which monitors and records the amount of a particular energy being consumed by the utility/structure. A second utility/structure (or energy consuming entity) has a similar metering device 308 associated therewith, and a third utility/structure (or energy consuming entity) likewise has a similar metering device 310 associated therewith. Each of the metering devices 306, 308 and 310 may be operatively coupled to the utility premise 304 so that readings/energy data being taken by the metering devices are transmitted to the device 12 for processing and storage. In some cases, the power lines 318 may include a transformer monitor(s) 312 that monitors and records the amount of a particular energy being distributed to the utilities/structures. The transformer monitor(s) 312 may also be operatively coupled to the utility premise 304 so that readings/energy data being taken by the transformer monitor(s) 312 may be transmitted to the device 12 for processing and storage. While only three metering devices 306-310 and one transformer monitor 312 is shown in FIG. 3, it should be understood that there can be any number of metering devices and transformer monitors. Similarly, there may be any number of utility premises and utilities/structures that belong to the utility network 302 and the utilities/structures could be any combination of utility consuming devices (e.g., households, buildings, lighting, gas or electric devices, clothes or dish washing machine, etc.).

Figure 4:
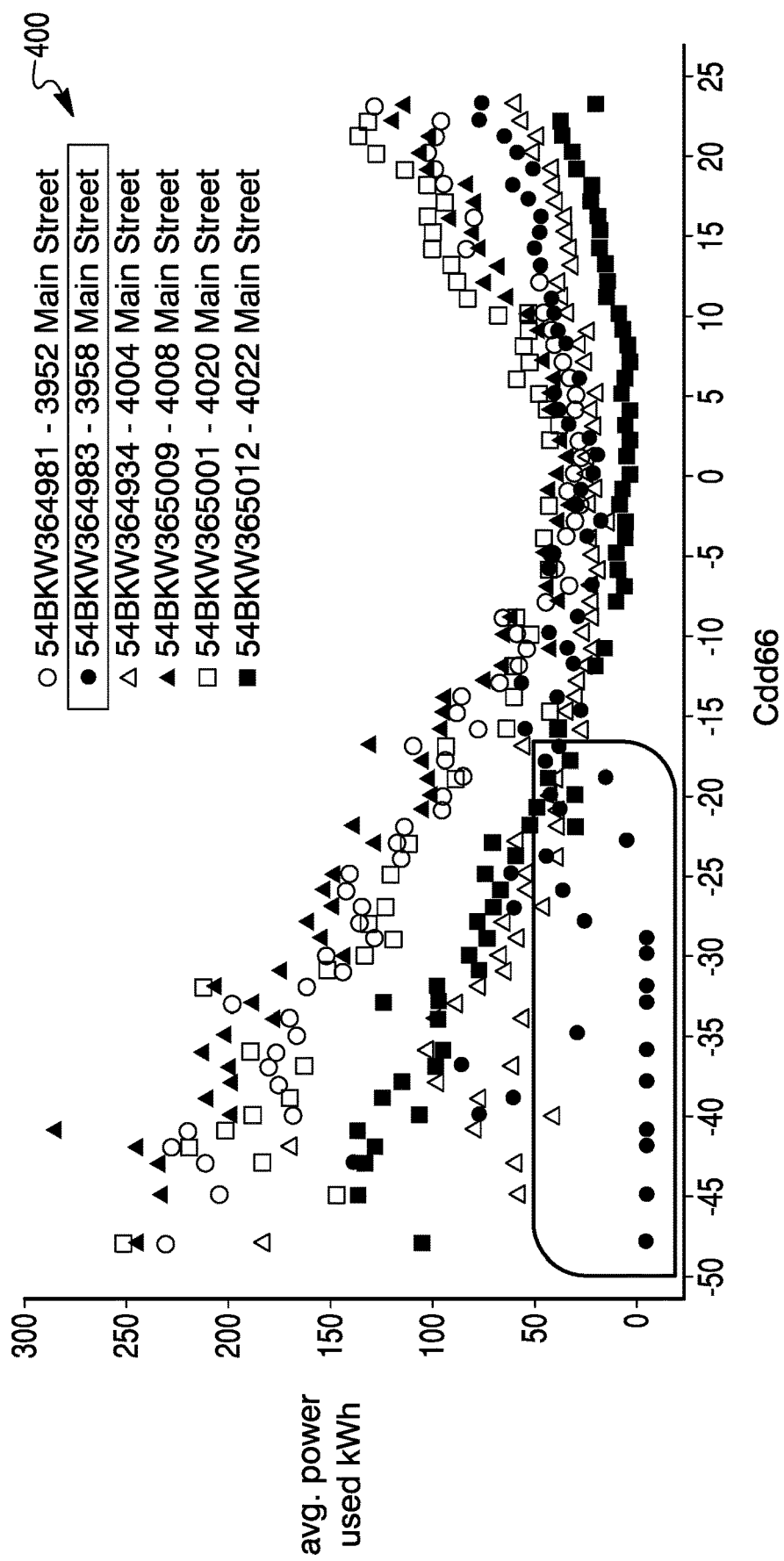
FIG. 4 is a diagram depicting analytic results.
Figure 5:
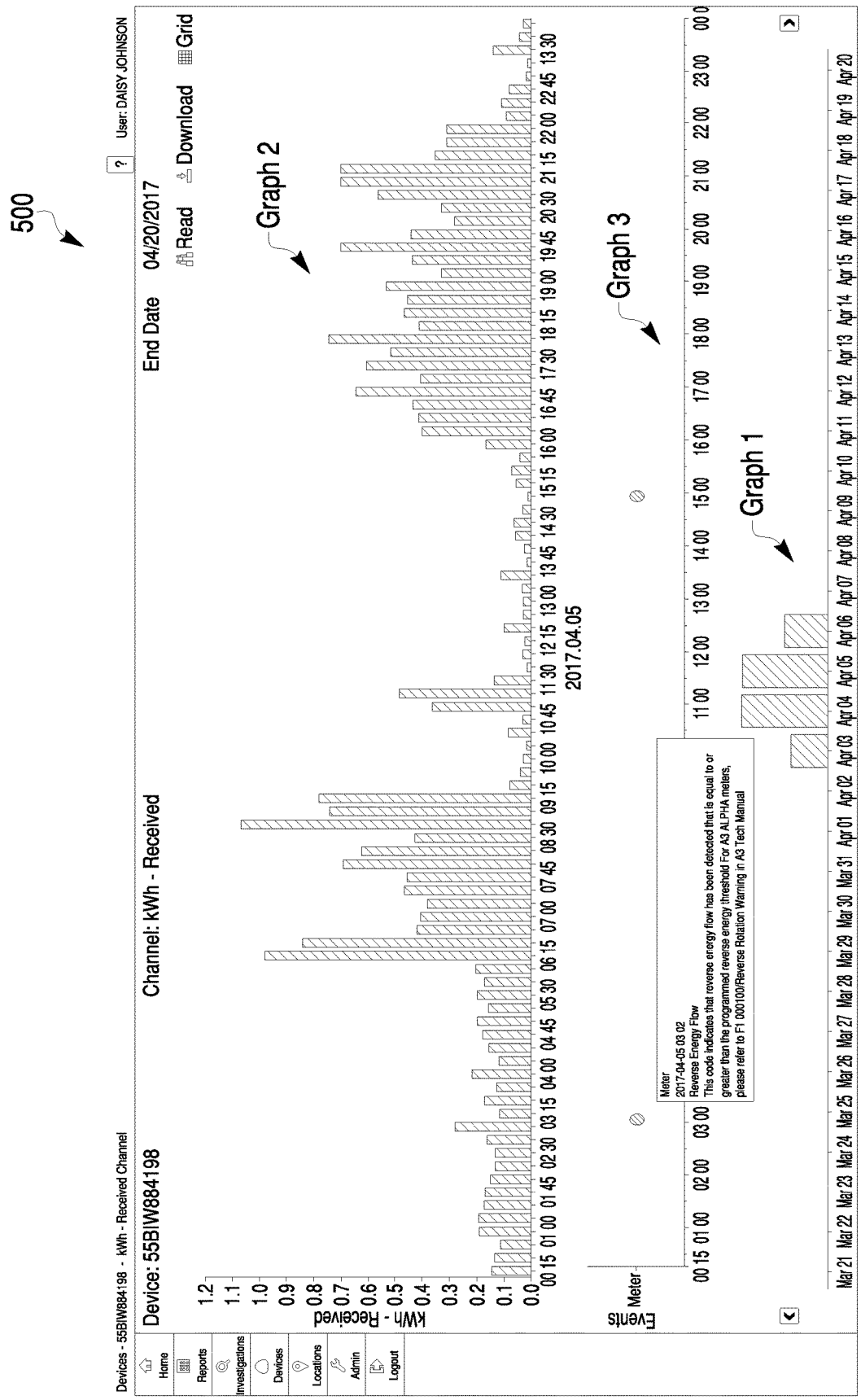
FIG. 5 is visual graphs depicting analytic results.

In some cases, the utility network 302 may operate according to an MDM system. As such, energy data sent to the device 12 may incorporate the amount of energy elicited or usage data of the utilities/structures and power lines 318 and the locations of the utilities/structures and power lines 318, and events that are imported from head-end servers managing the energy data collection in an AMI or AMR system. In some cases, the device 12 may use MDM analytics to validate, cleanse and process the energy data. In some instances, the device 12 may then use NTL analytics to examine the processed energy data to generate energy results that may include, for example, historic customer billing and account information using billing or time-of-use values in a utility customer information system, as well as detailed load-survey information on seasonally adjusted usage ranges for similar energy consumers (customer class and sub-class). In some examples, the device 12 may use NTL analytics to look at the energy results to identify the utilities/structures or the power lines 318 that fall outside of statistical norms. In some cases, the device 12 may detect certain types of diversion and usage anomalies, such as those caused by defective, slow or stopped meters, simple forms of meter bypass, neighborhood power diversion and unregistered consumers. In some cases, the device 12 may use NTL analytics to compare usage to predetermined thresholds and patterns of use and categorize utilities according to the type of utility or by certain customer classes and even by data, such as household size or business type. For instance, turning to FIG. 4, a visual scatter diagram 400 is provided depicting NTL analytics results for the average recorded energy (power) consumed for households/utilities. As shown (and squared off) in the bottom left hand corner of the scatter diagram 400, the device 12 identifies a set of outlying households/utilities. In this case, the outlying households/utilities have very little or zero recorded energy consumed. As such, the device 12 may decide whether to further investigate the outlying households/utilities. Turning to FIG. 5, visual graphs 500 are provided depicting NTL analytics results for a customer (i.e., Daisy Johnson). As shown in FIG. 5, Graph 1 illustrates the total recorded energy consumed at Daisy Johnson's residence for Apr. 3, 2017-Apr. 6, 2017 and Graph 2 illustrates the recorded energy consumed every fifteen minutes at Daisy Johnson's residence for Apr. 5, 2014. In some cases, the device 12 may use the NTL analytics to compare the recorded energy consumed to a reverse energy threshold. As shown in Graph 3, the device 12 identifies two outlying moments where the reverse energy flow has been detected that is equal to or greater than the reverse energy threshold. As such, the device 12 may decide whether to further investigate Daisy Johnson's residence based on the two outlying moments.

Figure 6:
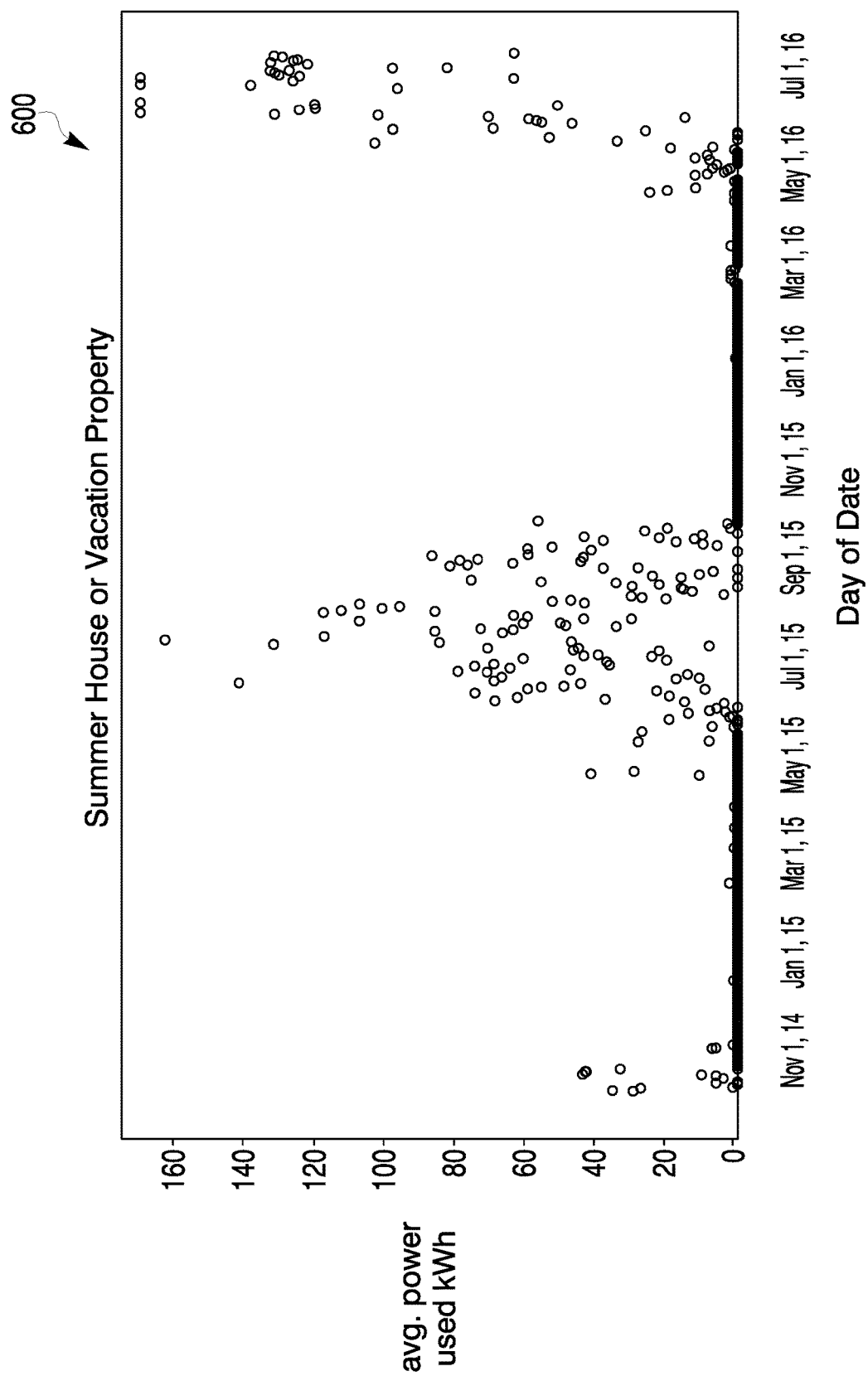
FIG. 6 is a diagram depicting analytic results.

Turning back to FIG. 3, in some cases, the device 12 may also access behavioral data 316. In some examples, the behavioral data 316 may be stored in a cloud computing environment 314. In some cases, the behavioral data 316 may be associated with the outlying utilities, utilities having a relationship with the outlying utilities, a geographical region where the outlying utilities are located, etc. For instance, as shown in FIG. 3, the behavioral data 316 may include Property Tax Data 320 for residence and/or businesses in a particular neighborhood, Geological Map Data 322 for the particular neighborhood, Real-Time Weather Data 324 for the particular neighborhood, Historical Weather Data 326 for the particular neighborhood, Crime Statistics 328 for the particular neighborhood, Social Media Data 330 for individuals residing in or referencing the particular neighborhood, and Micro-Economic Data 332 (e.g., average income for residence, typed of businesses, average household size, etc.) for the particular neighborhood. It is understood that the types of the behavioral data 316 shown in FIG. 3 are intended to be illustrative only and that the behavioral data 316 may include more or less data types and can include any type of data relevant to a utility or neighborhood/geographical region. In some instance, an NTL Models module 324 may track, validate, cleanse, process, and record the behavioral data 316. For example, turning to FIG. 6, a visual scatter diagram 600 is provided depicting an illustration the NTL Models module's 324 processed results of the Property Tax Data 320 with the average recorded energy consumed for an outlying household from FIG. 4. As shown, the average recorded energy for this outlying household is very little or zero during the fall through spring months, then spikes during the summer months. As such, the NTL Models module 324 is capable of capturing evidence that this outlying household may be a vacation home, explaining why a household that has Property Tax Data 320 also has very little or zero average recorded energy several months out of the year. In another example, the NTL Models module 324 may process the Property Tax Data 320 along with the average recorded energy consumed for an outlying household and find that there is no Property Tax Data 320 for the outlying household. As such, the NTL Models module 324 is capable of capturing evidence that this outlying household may be vacant, explaining why this outlying household has very little or zero average recorded energy. However, the NTL Models module 324 may also be capable of capturing evidence that households near the outlying household have increases in their average recorded energy. As such, the NTL Models module 324 may provide evidence showing that there may be a squatter residing in the outlying household and they have tapped into the neighboring household meters for energy.

Turning back to FIG. 3, in some cases, the processed behavioral data 316 may permit the device 12 to use the NTL analytics to divide individuals/energy consumers into groups on the basis of relationships/similarities that the members of the groups have with one another (e.g., similar sized households, similar location, similar average income, etc.). For example, rather than looking at all the processing behavioral data 316 as one unit, the device 12 may break them into related groups for analysis. These related groups may share common characteristics or experiences. In some examples, by seeing patterns over time within the related groups, the device 12 may determine whether there is a likelihood of energy theft in certain areas at or near the outlying utilities. If the device 12 determines there is a likelihood of energy theft, the device 12 may then generate descriptive results from the processed and grouped behavioral data 316 in the form of an NTL Dashboard that gives a detailed account and predictions of the likelihood that energy theft is or has occurred at or near the outlying utilities/households.

Figure 7A:
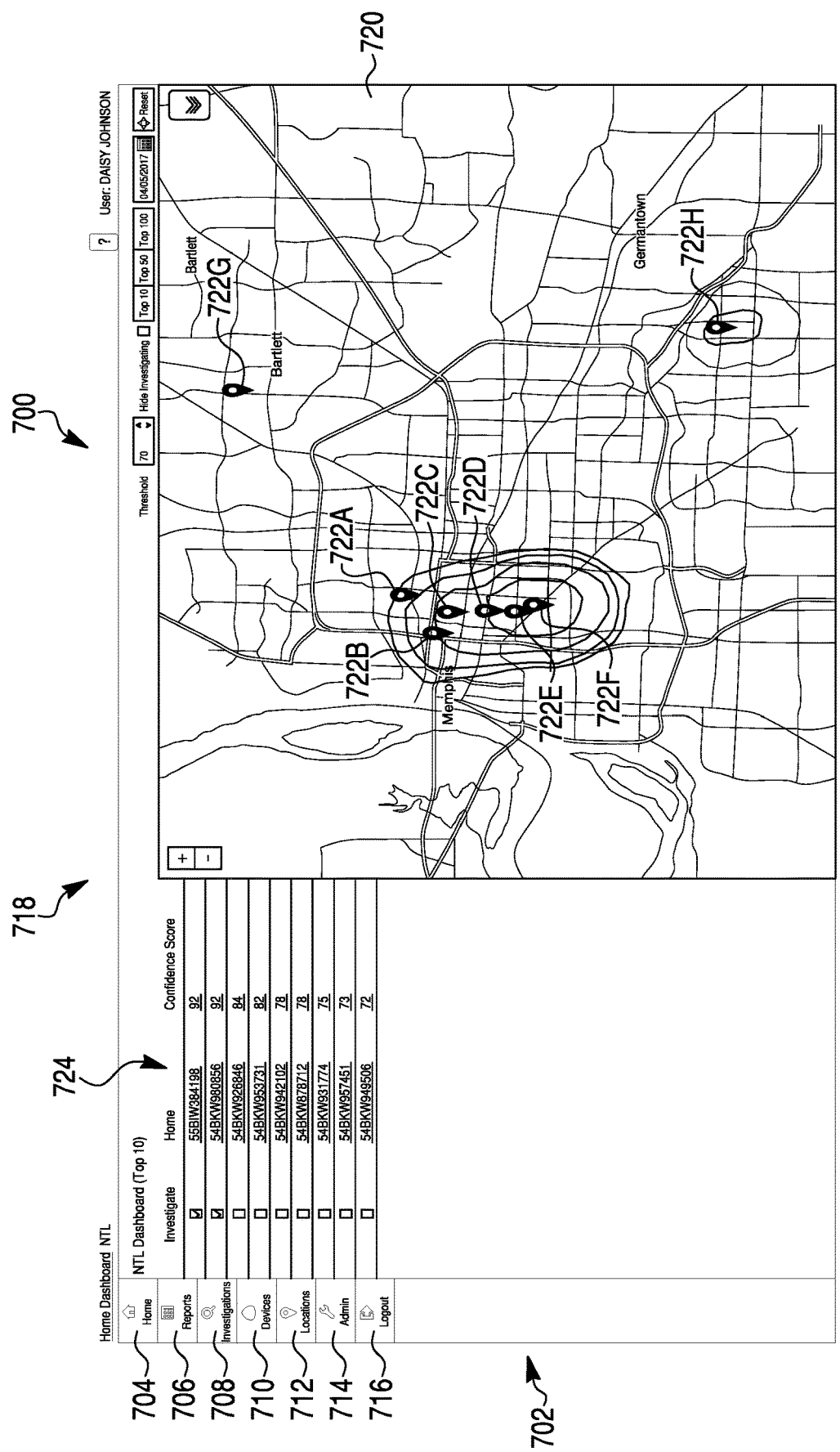
FIG. 7A is an example of an NTL Dashboard home screen.

FIG. 7A depicts an illustrative NTL Dashboard 700 generated by the device 12 on a display, an external device (e.g., external device(s) 24, from FIG. 1), or the remote device(s) 14 (e.g., a smart phone, tablet computer, laptop computer, personal computer, PDA, and/or the like). In some cases, the remote device 14 may be a field device used by an investigator, a technician, and/or an employee of the utility premise 304. According to various embodiments, the NTL Dashboard 700 may be an integrated, simple to use dashboard. In some cases, the NTL Dashboard 700 may enable the device 12 to send alerts, provide confidence scores, geographical maps, charts, notes, investigation summaries, etc. regarding energy theft from the utility network 302. In some instances, the NTL Dashboard 700 may be configured with user accounts that require user passwords to navigate through templates/screens of the NTL Dashboard 700. In some examples, the screens displayed by the NTL Dashboard 700 may configure the screens displayed based on the user/user account. For instance, the utility network 302 may span multiple areas or neighborhoods and investigators/technicians may be assigned to particular neighborhoods. As such, the NTL Dashboard 700 may limit what is displayed on the screens for a technician, having a user account, to only the neighborhoods that the technician is assigned. In another example, the device 12 may be configured to identify potential suspects of the energy theft. As such, the NTL Dashboard 700 may be configured to filter what is displayed on the screens based on the potential suspects. For example, the utility premise 304 may have a manager(s) with a user account and the NTL Dashboard 700 may be configured to display all the energy theft information on the screens for the manager(s). In some instances, the device 12 may determine that an employee of the utility premise 304 (e.g., a technician or investigator) may be a suspect associated with an outlying utility having a likelihood of energy theft. Accordingly, the NTL Dashboard 700 may display this information to the manager(s) on their screens. However, the technician who is a suspect of energy theft may also have a user account. As such, the NTL Dashboard 700 may filter this information from the display screens for the technician. Accordingly, the technician may not be informed that they are a potential suspect and the manager(s) may send a different technician or investigator to check the outlying utility and/or the area where the outlying utility is located for evidence of energy theft. These are just a couple examples of how the device 12/NTL Dashboard 700 can filter the descriptive results and configure display screens and are not intended to limit the scope of the present system. As such, the device 12/NTL Dashboard 700 can filter the descriptive results and configure display screens in any manner and as needed.

As shown in FIG. 7A, icons may be located on a sidebar 702 of the NTL Dashboard 700. The icons may include a home icon 704, a reports icon 706, an investigations icon 708, a devices/utilities icon 710, a locations icon 712, an administrations icon 714, and a logout icon 716, for example. Each icon may be selected to display their corresponding template/screen of the NTL Dashboard. In this example, as shown in FIG. 7A, the home icon 704 has been selected to display a home screen 718 or the NTL Dashboard 700 defaults to the home screen 718. In some cases, the home screen 718 may provide a geographical map 720 that has pins 722A-722H showing/highlighting the location of outlying utilities where there is a likelihood of energy theft. In some instances, the geographical map 720 may have a zoom function and in combination with the pins 722A-722H, provide a user (e.g., an investigator or technician) with an increased location function that pinpoints the precise location of the outlying utility and/or the likelihood of energy theft. In some cases, the home screen 718 may also provide a selectable list 724 of the outlying utilities and a user can select an outlying utility from the list using an external device, such as a mouse, keyboard, and/or touchscreen. It should be understood that such features of the home screen 718 are intended to be illustrative only and the home screen 718 may be configured in any manner and include any number of features, such as icons, sidebars, scroll bars, graphs, thumbnails, etc.

Figure 7B:
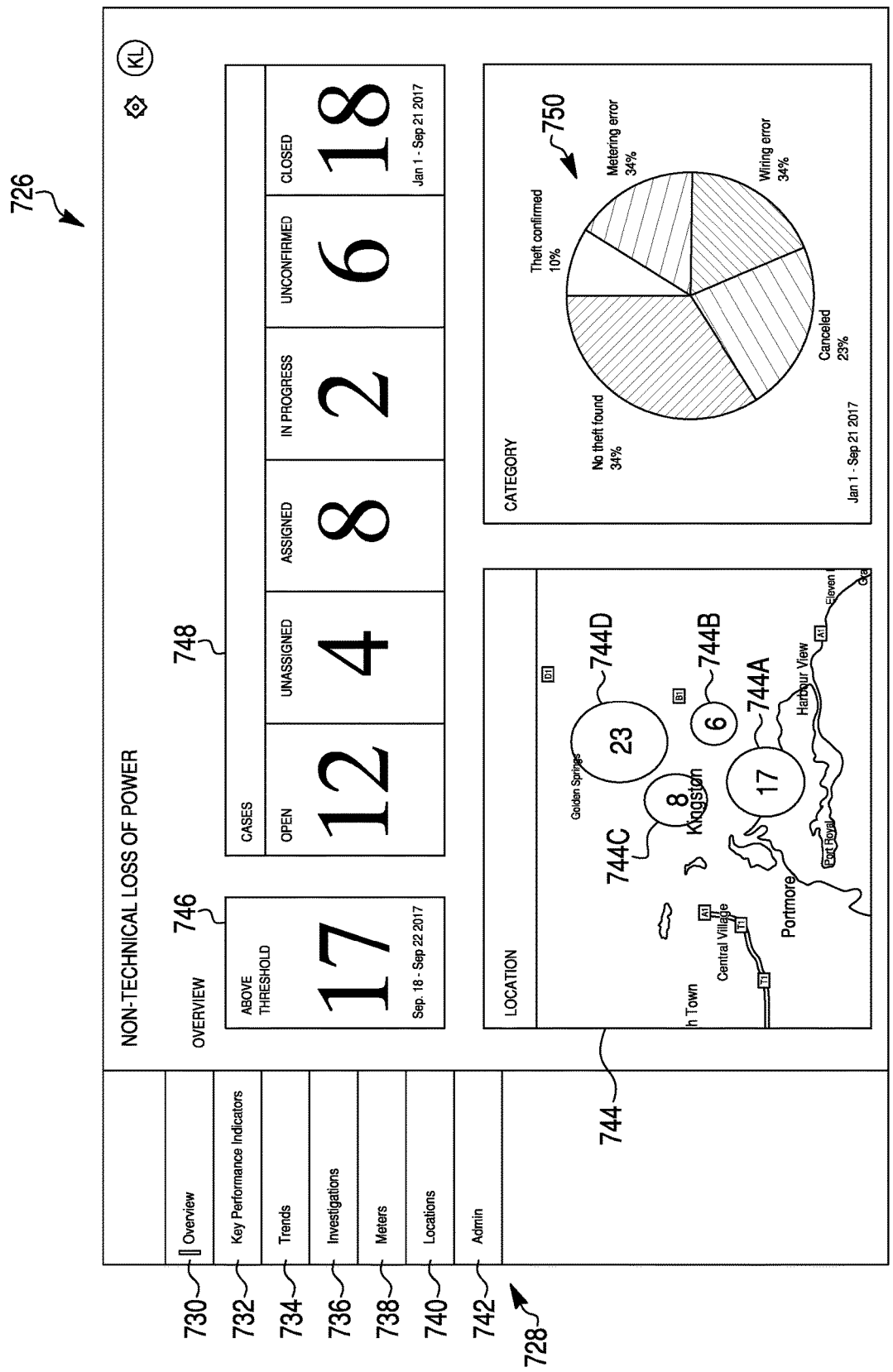
FIG. 7B is an example of an NTL Dashboard report screen.

Turning to FIG. 7B, in this example, the device 12 may generate a reports screen 726 from the NTL Dashboard 700 when the reports icon 706 (shown in FIG. 7A) is selected. In some cases, icons may be located on a sidebar 728 of the reports screen 726. The icons may include an overview icon 730, a key performance indicators icon 732, a trends icon 734, an investigations icon 736, a meters icon 738, a locations icon 740, and an administrations icon 742, for example. Each icon may be selected to display their corresponding template/screen of the NTL Dashboard 700. In this example, as shown in FIG. 7B, the overview icon 730 has been selected to display the reports screen 726 or the NTL Dashboard 700 defaults to an overview depiction of the reports screen 726. In some cases, the reports screen 726 may provide a geographical map 744 that has indicators 744A-744D that highlight how many outlying utilities exist in a certain area. In some examples, the indicators 744A-744D may have a visual indication of how likely the outlying utilities are believed to be related to energy theft. For instance, the indicators 744A-744D may be color coordinated to show the likelihood that the outlying utilities are related to energy theft. In some cases, the reports screen 726 may include a thumbnail 746 for displaying the number of outlying utilities or the number of utilities that are above or below an energy usage/elicited threshold. In some examples, the reports screen 726 may also include a cases thumbnail 748 that includes a set of thumbnails that each displays a case number and the status of those cases. In some instances, the reports screen 726 may also include a chart(s) 750 that shows the results of each investigation of an outlying utility. These results may be over any given amount of time, such as over the current year, month, week, day, etc. It should be understood that such features of the reports screen 726 are intended to be illustrative only and the reports screen 726 may be configured in any manner and include any number of features, such as icons, sidebars, scroll bars, graphs, thumbnails, etc.

Figure 7C:
FIG. 7C is an example of an NTL Dashboard investigations screen.

Turning to FIG. 7C, in this example, the device 12 may generate an investigations screen 752 from the NTL Dashboard 700 when the investigations icon 708 (shown in FIG. 7A) or the investigations icon 736 (shown in FIG. 7B) is selected. In some cases, icons may be located on a sidebar 754 of the investigations screen 752. The icons may include a home icon 756, an investigations icon 758, a meters icon 760, a sites (locations) icon 762, and a logout icon 764, for example. Each icon may be selected to display their corresponding template/screen of the NTL Dashboard 700. In some cases, the investigations screen 752 may provide a report 766 about the outlying utility having a likelihood of energy theft and the potential causes and suspects of the energy theft. As shown, the report 766 can include the outlying utility (site) identification number, an opened date, a closed data, an outcome, a reason for the generation of the investigation, an assigned date, an identification of a person who is assigned to investigate, a description of the case, evidence gathered from an investigation of the outlying utility, and names and photographs of the potential suspects. In some cases, the report 766 can be configured to include less or more information as needed. Moreover, the report 766 may be filtered based on the user account and the potential suspects. It should be understood that such features of the investigations screen 752 are intended to be illustrative only and the investigations screen 752 may be configured in any manner and include any number of features, such as icons, sidebars, scroll bars, graphs, thumbnails, etc.

Figure 7F:
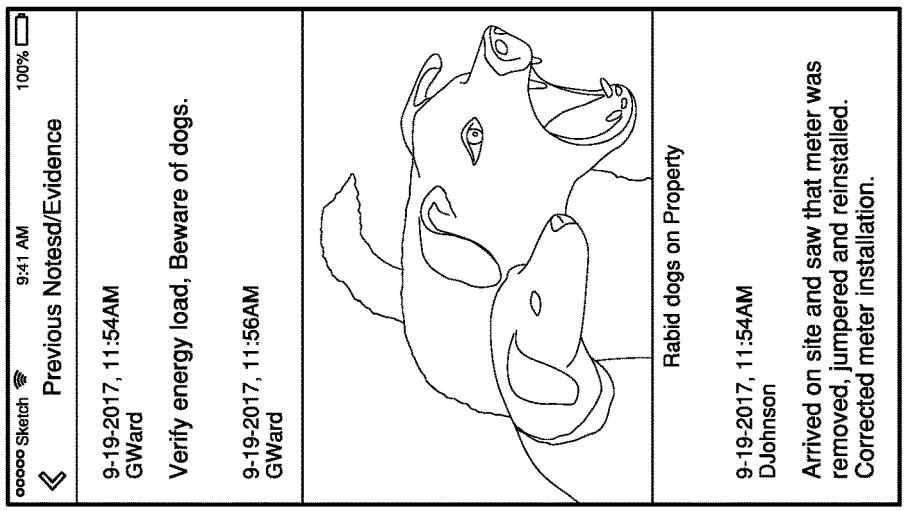
FIG. 7F is an example of an NTL Dashboard administrations screen.
Figure 7E:
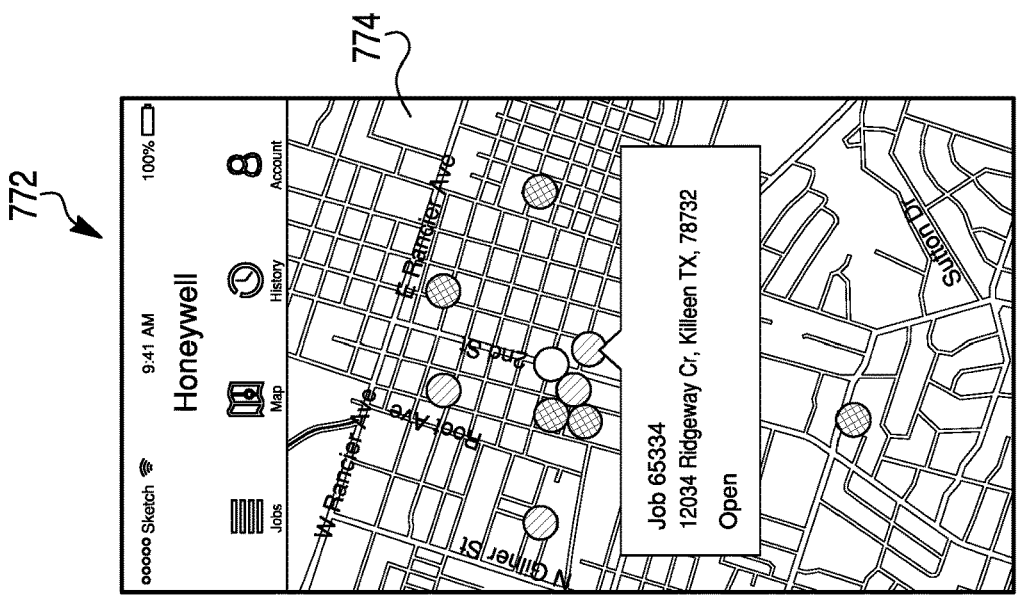
FIG. 7E is an example of an NTL Dashboard locations screen.
Figure 7D:
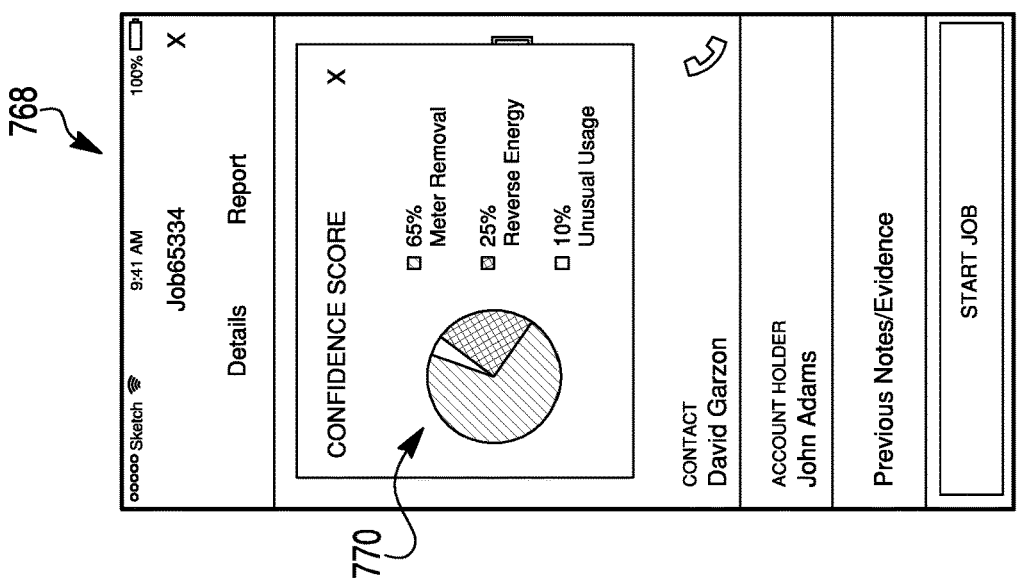
FIG. 7D is an example of an NTL Dashboard device screen.

Turning to FIG. 7D, in this example, the device 12 may generate a devices screen 768 from the NTL Dashboard 700 when the devices icon 710 (shown in FIG. 7A), or the meters icon 738 (shown in FIG. 7B), or the meters icon 760 (shown in FIG. 7C) is selected. In some cases, the devices screen 768 may provide a confidence score of whether there is a likelihood of energy theft associated with an outlying utility. For example, as shown, the confidence score may be shown using a chart(s) 770 that includes a score or percentage of the likelihood of energy theft (e.g., unusual usage) and a set of scores or percentages of alternate reasons the outlying utility is an outlier in the energy results (e.g., meter removal, reverse energy, etc.). It should be understood that such features of the devices screen 768 are intended to be illustrative only and the devices screen 768 may be configured in any manner and include any number of depictions of the confidence score such as icons, bar graphs, scatter plots, thumbnails, etc. Moreover, the devices screen 768 may also include any number of features, such as icons, sidebars, scroll bars, etc.

Turning to FIG. 7E, in this example, the device 12 may generate a locations screen 772 from the NTL Dashboard 700 when the locations icon 712 (shown in FIG. 7A), or the locations icon 740 (shown in FIG. 7B), or the sites icon 762 (shown in FIG. 7C) is selected. In some cases, the locations screen 772 may display detailed map 774 of a particular neighborhood configured specifically for an investigator/technician assigned to that particular neighborhood. As shown, the map 774 may include indicators that highlight how many outlying utilities exist in the neighborhood and the addresses of those outlying utilities. In some examples, the indicators may have a visual indication of how likely the outlying utilities are believed to be related to energy theft. For instance, the indicators may be color coordinated to show the likelihood that the outlying utilities are related to energy theft. It should be understood that such features of the locations screen 772 are intended to be illustrative only and the locations screen 772 may be configured in any manner and include any number of depictions of the detailed map 774. Moreover, the devices screen 768 may also include any number of features, such as icons, sidebars, scroll bars, graphs, thumbnails, etc.

Turning to FIG. 7F, in this example, the device 12 may generate an administrations screen 774 from the NTL Dashboard 700 when the administrations icon 714 (shown in FIG. 7A) or the administrations icon 742 (shown in FIG. 7B) is selected. In some cases, the administrations screen 774 may allow a user of the remote device 14 to input and record/send a response of whether the energy theft associated with the outlying utility occurred. Moreover, the user may also input a detailed description of the evidence found at an outlying utility, actions taken, and general notes about the outlying utility and/or the area around the outlying utility. As shown, the user gave the response that they "Arrived on site and saw that meter was removed, jumpered and reinstated. Corrected meter installation." The user also left a note that they "Verify energy load. Beware of dogs." It should be understood that such features of the administrations screen 774 are intended to be illustrative only and the administrations screen 774 may be configured in any manner that allows a user to provide a response of whether the energy theft associated with an outlying utility occurred. Moreover, the administrations screen 774 may also include any number of features, such as icons, sidebars, scroll bars, graphs, thumbnails, etc.

In some cases, the device 12 may receive responses of whether energy theft associated with the outlying utilities occurred and refine its operation of detecting energy theft from the utility network 302. In some instances, the device 12 may be capable of learning from the responses without being explicitly programmed. Instead the device 12 may use the responses to build logic based on the data obtained from the responses. In conjunction with the behavioral data and cloud computing, described herein, the capability of the device 12 to learn from patterns in the data may improve the device's ability to analyze those big chunks of data from multiple sources. For instance, in some cases, the device 12 may be capable of discovering interesting structures in the behavioral data. In some examples, the device 12 may be capable of discovering rules that describe large portions of the behavioral data. In some instances, the device 12 may improve its ability to discover inherent groupings in the behavioral data. In any scenario, this ability to learn from the responses may allow the device 12 to produce reliable, repeatable descriptive results and predictions and uncover "hidden insights" through historical relationships and trends in the behavioral data. As such, in some examples, the device 12 may be configured to progressively improve the energy theft predictions of the descriptive results from the responses and/or feedback.

Figure 8:
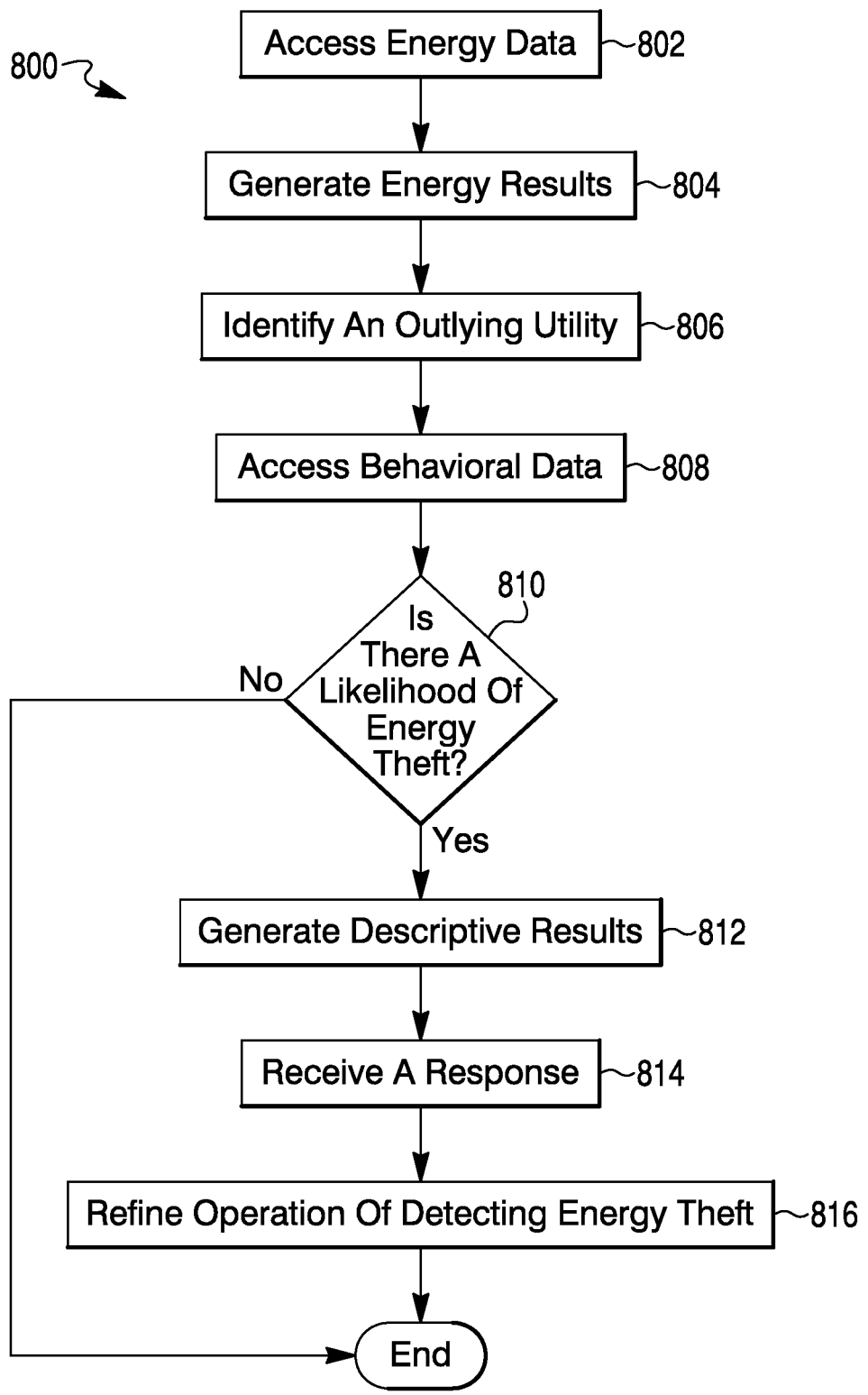
FIG. 8 is an illustrative method.

FIG. 8 depicts an illustrative method 800 for detecting energy theft from a utility network. The method 800 begins at step 802, where energy data is accessed for utilities indicating the amounts of energy elicited and the locations of the utilities. In some examples, the utilities may include households, buildings, lighting, gas or electric devices, clothes or dish washing machine, etc. and the energy data may be received from metering or monitoring devices configured to monitor the utilities. At step 804, energy results may be generated from the energy data. In some examples, MDM analytics may be used to validate, cleanse and process the energy data and NTL analytics may be used to examine the processed energy data to generate the energy results that may include, for example, historic customer, billing and account information using billing or time-of-use values in utility customer information systems, as well as detailed load-survey information on seasonally adjusted usage ranges for similar energy consumers (customer class and sub-class). At step 806, outlying utilities in energy results may be identified. In some examples, NTL analytics may be used to compare energy data to predetermined thresholds and patterns of use by certain utility types/groups/classes to identify the outlying utilities. At step 808, behavioral data associated with the outlying utilities, utilities having a relationship with the outlying utilities, and a geographical region where the outlying utilities are located is accessed. In some examples, the behavioral data may include Property Tax Data for residence and/or businesses in a particular neighborhood, Geological Map Data for the particular neighborhood, Real-Time Weather Data for the particular neighborhood, Historical Weather Data for the particular neighborhood, Crime Statistics for the particular neighborhood, Social Media Data for individuals referencing the particular neighborhood, and Micro-Economic Data (e.g., average income for residence, typed of businesses, average household size, etc.) for the particular neighborhood. At step 810, it is determined whether there is a likelihood of energy theft associated with the outlying utilities based on the behavioral data. If it is determined that there is not a likelihood of energy theft, method 800 ends. However, if it is determined there is a likelihood of energy theft, at step 812, descriptive results are generated from the behavioral data indicating the likelihood of energy theft associated with the outlying utilities. In some examples, an NTL Dashboard may be generated that gives a detailed account and predictions of the likelihood that energy theft is or has occurred at or near the outlying utilities. In some examples, the NTL Dashboard may be an integrated, simple to use dashboard configured to send alerts, provide confidence scores, geographical maps, charts, notes, investigation summaries, etc. regarding energy theft from the utility network. At step 814, a response is received of whether the energy theft associated with the outlying utilities occurred. In some examples, the response may also include evidence found at the outlying utilities, actions taken by an investigator/utility network employee, and general notes about the outlying utilities and/or the areas around the outlying utilities. At step 816, operation of the detecting of energy theft from the utility network is refined using the response of whether the energy theft associated with the outlying utilities occurred. In some examples, logic may be built and learned from the data obtained from the responses. This ability to learn from the responses may allow the production of reliable, repeatable descriptive results and predictions and uncover "hidden insights" through historical relationships and trends in the behavioral data. In some examples, energy theft detections and predictions of the descriptive results may progressively improve from the responses and/or feedback.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic or optical disks, magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Also, in the above Description, various features may be grouped together to streamline the disclosure. This should not be interpreted as intending that an unclaimed disclosed feature is essential to any claim. Rather, subject matter may lie in less than all features of a particular disclosed embodiment. Thus, the following claims are hereby incorporated into the Description as examples or embodiments, with each claim standing on its own as a separate embodiment, and it is contemplated that such embodiments can be combined with each other in various combinations or permutations. The scope of the system should be determined with reference to the appended claims, along with the full scope of equivalents to which such claims are entitled.

What is claimed is:

1. A device for detecting energy theft from a utility network, the device configured to:
   access energy data for utilities indicating at least amounts of energy elicited and locations of the utilities;
   generate energy results from the energy data;
   identify an outlying utility in the energy results;
   access behavioral data associated with the outlying utility, a set of utilities having a relationship with the outlying utility, and a geographical region where the outlying utility is located;
   determine whether there is a likelihood of energy theft associated with the outlying utility based on the behavioral data;
   generate descriptive results from the behavioral data indicating the likelihood of energy theft associated with the outlying utility;
   receive a response of whether the energy theft associated with the outlying utility occurred;
   refine operation of the detecting of energy theft of the device using the response of whether the energy theft associated with the outlying utility occurred; and
   wherein the behavioral data comprises of at least one of property tax data, micro-economic data, weather data, crime statistics, and social media data.

2. The device of claim 1, the device further configured to determine a confidence score of whether there is the likelihood of energy theft associated with the outlying utility.

3. The device of claim 2, wherein the confidence score further includes a set of scores for alternate reasons the outlying utility is an outlier in the energy results.

4. The device of claim 1, wherein the descriptive results includes an alert and the device is further configured to send the alert to a remote device for an investigator to check an area where the outlying utility is located for evidence of the energy theft.

5. The device of claim 4, wherein the investigator sends the response of whether the energy theft associated with the outlying utility occurred based on the evidence of the energy theft.

6. The device of claim 1, wherein the device further configured to:
   determine a potential suspect of the energy theft;
   filter the descriptive results based at least on the potential suspect of the energy theft; and
   send the filtered descriptive results to an employee.

7. The device of claim 6, wherein the potential suspect includes the employee.

8. The device of claim 1, wherein the descriptive results comprise graphs generated from a set of the behavioral data, news activity associated with the geographical region, and maps of the geographical region highlighting at least the outlying utility.

9. The device of claim 1, wherein the energy results are configured to be categorized according to types of the utilities.

10. A system for detecting energy theft from a utility network, the system comprising:
    a set of meter devices for accumulating energy data for utilities indicating at least amounts of energy elicited and locations of the utilities; and
    a device operatively coupled to the set of meter devices and configured to:
    receive the energy data;
    generate energy results from the energy data, wherein the energy results are configured to be categorized according to types of the utilities;
    identify an outlying utility in the energy results;
    access behavioral data associated with the outlying utility, a set of utilities having a relationship with the outlying utility, and a geographical region where the outlying utility is located;
    determine whether there is a likelihood of energy theft associated with the outlying utility based on the behavioral data;
    generate descriptive results from the behavioral data indicating the likelihood of energy theft associated with the outlying utility;
    receive a response of whether the energy theft associated with the outlying utility occurred;
    refine operation of the detecting of energy theft of the device using the response of whether the energy theft associated with the outlying utility occurred; and
    wherein the behavioral data comprises of at least one of property tax data, micro-economic data, weather data, crime statistics, and social media data.

11. The system of claim 10, the device further configured to determine a confidence score of whether there is the likelihood of energy theft associated with the outlying utility.

12. The system of claim 10, wherein the descriptive results include an alert and the device is further configured to send the alert to a remote device for an investigator to check an area where the outlying utility is located for evidence of the energy theft.

13. The system of claim 12, wherein the investigator sends the response of whether the energy theft associated with the outlying utility occurred based on the evidence of the energy theft.

14. The system of claim 10, wherein the device is further configured to:
    determine a potential suspect of the energy theft;

filter the descriptive results based at least on the potential suspect of the energy theft; and send the filtered descriptive results to an employee.

15. The system of claim 14, wherein the potential suspect includes the employee.

16. A method for detecting energy theft, the method comprising:
    accessing energy data for utilities indicating at least amounts of energy elicited and locations of the utilities;
    generating energy results from the energy data;
    identifying an outlying utility in the energy results;
    accessing behavioral data associated with the outlying utility, a set of utilities having a relationship with the outlying utility, and a geographical region where the outlying utility is located;
    determining whether there is a likelihood of energy theft associated with the outlying utility based on the behavioral data;
    generating descriptive results from the behavioral data indicating the likelihood of energy theft associated with the outlying utility;
    receiving a response of whether the energy theft associated with the outlying utility occurred;
    refining operation of the detecting of energy theft of the device using the response of whether the energy theft associated with the outlying utility occurred; and
    wherein the behavioral data comprises of at least one of property tax data, micro-economic data, weather data, crime statistics, and social media data.

17. The method of claim 16, further comprising
    determining a confidence score of whether there is the likelihood of energy theft associated with the outlying utility.

18. The method of claim 16, wherein the descriptive results includes an alert and the device is further configured to send the alert to a remote device for an investigator to check an area where the outlying utility is located for evidence of the energy theft.

19. The method of claim 16, further comprising:
    determining a potential suspect of the energy theft;
    filtering the descriptive results based at least on the potential suspect of the energy theft; and
    sending the filtered descriptive results to an employee.

* * * * *